United States Patent [19]

Healey, III

[11] 4,070,635

[45] Jan. 24, 1978

[54] DELAY LINE OSCILLATOR WITH PHASE LOCKED LOOP FOR REDUCING PHASE FLUCTUATIONS

[75] Inventor: Daniel J. Healey, III, Baltimore, Md.

[73] Assignee: Westinghouse Electric Corporation, Pittsburgh, Pa.

[21] Appl. No.: 691,163

[22] Filed: May 28, 1976

[51] Int. Cl.² .......................... H03B 3/04; H03B 5/00
[52] U.S. Cl. ........................................ 331/19; 331/25; 331/135; 331/172
[58] Field of Search ................. 331/18, 19, 25, 107 A, 331/135, 172

[56] References Cited

U.S. PATENT DOCUMENTS

| | | | |
|---|---|---|---|
| 3,626,315 | 12/1971 | Stirling et al. | 331/19 |
| 3,936,765 | 2/1976 | Lewis et al. | 331/135 X |
| 3,962,652 | 6/1976 | Zarin et al. | 331/25 X |

Primary Examiner—Siegfried H. Grimm
Attorney, Agent, or Firm—R. M. Trepp

[57] ABSTRACT

A phase locked oscillator provides an agile frequency signal source with low phase fluctuations for use in radar and communications systems wherein the phase fluctuations of a predetermined input signal are reduced by the phase locked oscillator by modulating the phase of a delayed feedback signal in response to the phase difference between the input signal and the output signal.

21 Claims, 10 Drawing Figures

FREQUENCY SPECTRUM OF C AND/OR D

FIG. 8

FREQUENCY SPECTRUM OF E

DELAY LINE OSCILLATOR WITH PHASE LOCKED LOOP FOR REDUCING PHASE FLUCTUATIONS

BACKGROUND OF THE INVENTION

1. Field of the Invention:

This invention relates to oscillators, particularly to phase locked oscillators to provide an agile frequency carrier with low phase fluctuations, $L$ (f), for radar and communication applications.

2. Description of the Prior Art:

In electronic countermeasure technology, a delay line oscillator is used with limited success to remember an RF input signal. An input signal to the delay line oscillator will be amplified and coupled to the oscillator output. A portion of the output signal is fed through a delay line and then fed back by means of a switch to the oscillator amplifier along with the input signal. The input signal is then removed by means of a switch leaving the delayed feedback signal as the only input to the oscillator amplifier. The output of the oscillator will then be governed by the delayed feedback signal.

A delay line oscillator has a plurality of natural frequencies which are orderly spaced at intervals of $1/\tau$ where $\tau$ is the total delay time in the feedback loop. When the error between the input frequency and one of the "natural" frequencies of a delay line oscillator is less than a certain value, the output frequency of oscillation very nearly coincides with the input frequency. The natural frequencies occur at those frequencies for which the incremental loop gain exceeds unity when the feedback loop is closed and, simultaneously, experience precisely $2\pi n$ phase shift where n is an integer. The natural frequencies are spaced at intervals of $1/\tau$ where $\tau$ is the delay of the line plus the group delay of the remaining circuitry comprising the feedback arrangement. The set of natural frequencies can be shifted in absolute frequency through variation of the phase introduced by a phase shifter.

A delay line oscillator is commercially available for coverage from the 2 to 4 gigahertz band and can provide "memory" times on the order of 10 microseconds, utilizing a 0.1 microsecond electromagnetic delay line when the uncertainty between the input or priming frequency and a natural frequency is within a predetermined range. A very important element in the 2 to 4 gigahertz system is the amplifier limiter which exhibits negligible incremental gain variation over the 2 to 4 gigahertz band as a function of input signal level up to the point where 10 to 20 db of limiting occurs. When the feedback loop is closed in response to an input signal, and the input signal is removed from the input, phase runout occurs and the oscillator reverts to oscillation at the nearest natural frequency unless an incremental gain is larger at some natural frequency farther removed.

If a priming signal is continually applied to the delay line oscillator and is of a level sufficiently large to prevent regeneration of noise at other natural frequencies having larger incremental gain, the output frequency can be made to have a frequency accuracy approaching that of the priming signal. Reference is made to a publication by R. Adler, entitled "A Study of Locking Phenomena in Oscillators", found in the Proceedings of the IRE and Waves and Electrons, June 1946, pages 351 through 357, which discusses in detail the performance attainable in LC oscillators. Adler's results are applicable to a primed delay line oscillator when the Q in Adler's equations is replaced by the quantity $\pi f_o \tau$.

In an oscillator, a fundamental parameter that determines $L$ (f) (the phase noise sideband spectrum) is the group delay $d\phi/d\omega$ of the feedback transmission network of the oscillator. Expressed as $d\phi/df$, the phase shifting property of the simple resonator that is usually employed as the principal frequency determining element is simply described by Equation (1):

$$d\phi/df = (2Q/f_o) \text{ radians/hertz} \qquad (1)$$

where $d\phi$ represents the change in phase; df represents the change in frequency; $f_o$ represents the average frequency of the oscillator; and Q represents the ratio of the reactance to the effective loaded resistance of a conventional L-C resonator's inductor. Equation (1) applies when the amplifier phase shift is negligible so that operation of the oscillator is very nearly the resonant frequency of the resonator. Equation (2) is applicable when the frequency control in an oscillator is provided by a delay line rather than an L-C resonator.

$$d\phi/df = -2\pi\tau \text{ radians/hertz} \qquad (2)$$

At the present time, with a frequency tuning band of 10%, it is difficult to realize $d\phi/df$ exceeding $10^{-7}$ radians per hertz in a conventional L-band VCO that employs a bipolar transistor as an amplifier-limiter and a varactor tuned loaded transmission line resonator for selecting the frequency of oscillation. The limitation in attainable $d\phi/df$ in the VCO results in serious limitations in the attainable $L$ (f) from the VCO when multifrequency selection is to be provided by a phase locked VCO.

A $d\phi/df$ of $10^{-6}$ radians per hertz would, however, adequately meet the $L(f)$ requirement of both ground based low to medium PRF MTI radar carrier frequency supplies, as well as $L$ (f) requirements for high duty factor (50%) high PRF MTI radar sets. With such stability, a stable phase locked loop with excellent transient settling behavior becomes feasible since the loop band width needed in the phase locked loop is only 50 to 100 kilohertz.

A significant measure of the noise content of a microwave signal is the indication of the phase power spectrum of the signal as provided by the parameter $L$ (f) which is a frequency domain measure of phase fluctuations (noise, instability, modulation). $L$ (f) is defined as the ratio of the power in one phase noise sideband, referred to the input carrier frequency, on a per hertz of bandwidth spectral density basis, to the total signal power, at Fourier frequency $f$ from the signal's average frequency $f_o$ of the signal.

Therefore, in order to provide an agile frequency source having low $L$ (f), it is desirable to utilize a phase locked oscillator which may realize a $d\phi/df$ of $10^{-6}$ radians per hertz and which can oscillate at a plurality of frequencies. In addition, it is desirable that the stability and frequency of the phase locked oscillator may be maintained without controlling the temperature of any of the components in the oscillator.

SUMMARY OF THE INVENTION

In accordance with the present invention, a method and apparatus for generating a frequency signal with low phase fluctuations, $L$ (f), comprise generating an input signal with low phase fluctuations, generating an output signal in accordance with the input signal, generating a delayed feedback signal derived from said output signal having the same frequency as the output signal, and modulating the phase of the delayed feedback signal in response to the phase difference between the input and output signals whereby the phase fluctuations of said output signal are substantially reduced.

DESCRIPTION OF THE PREFERRED EMBODIMENTS

Figure 1:
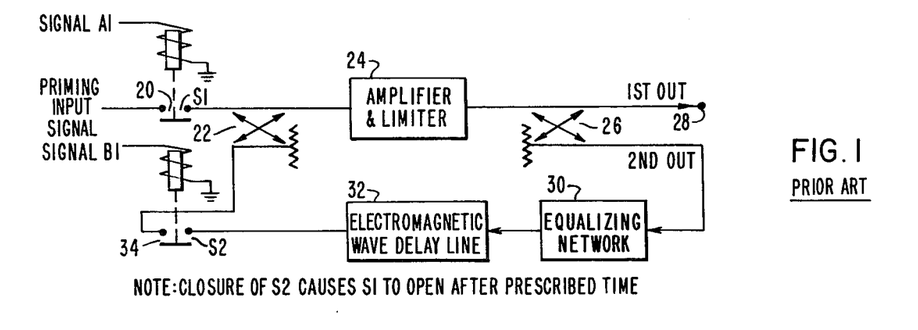
FIG. 1 is a block diagram of a delay line oscillator, also known as a keyed oscillator, of the prior art.

Referring to FIG. 1, which is a block diagram of a prior art delay line oscillator, the priming input signal is coupled through switch 20 and coupler 22 to the input of amplifier and limiter 24. Switch 20 is controlled by signal A1. The output of amplifier and limiter 24 is connected to an input of coupler 26. A first output of coupler 26 is connected to the output terminal 28 and a second output of coupler 26 is connected to the input of equalizing network 30. The output of equalizing network 30 is coupled to the input of electromagnetic wave delay line 32. The output of electromagnetic wave delay line 32 is coupled through switch 34 to an input of coupler 22. Switch 34 is controlled by signal B1, which will open and close switch 34 to provide a feedback signal. Switch 20 is closed to allow a priming input signal to circulate to the output terminal 28 and to switch 34. After switch 34 is closed, switch 20 is opened to remove the priming input signal. The oscillator will continue to oscillate governed by the delayed feedback signal from switch 34.

Figure 2:
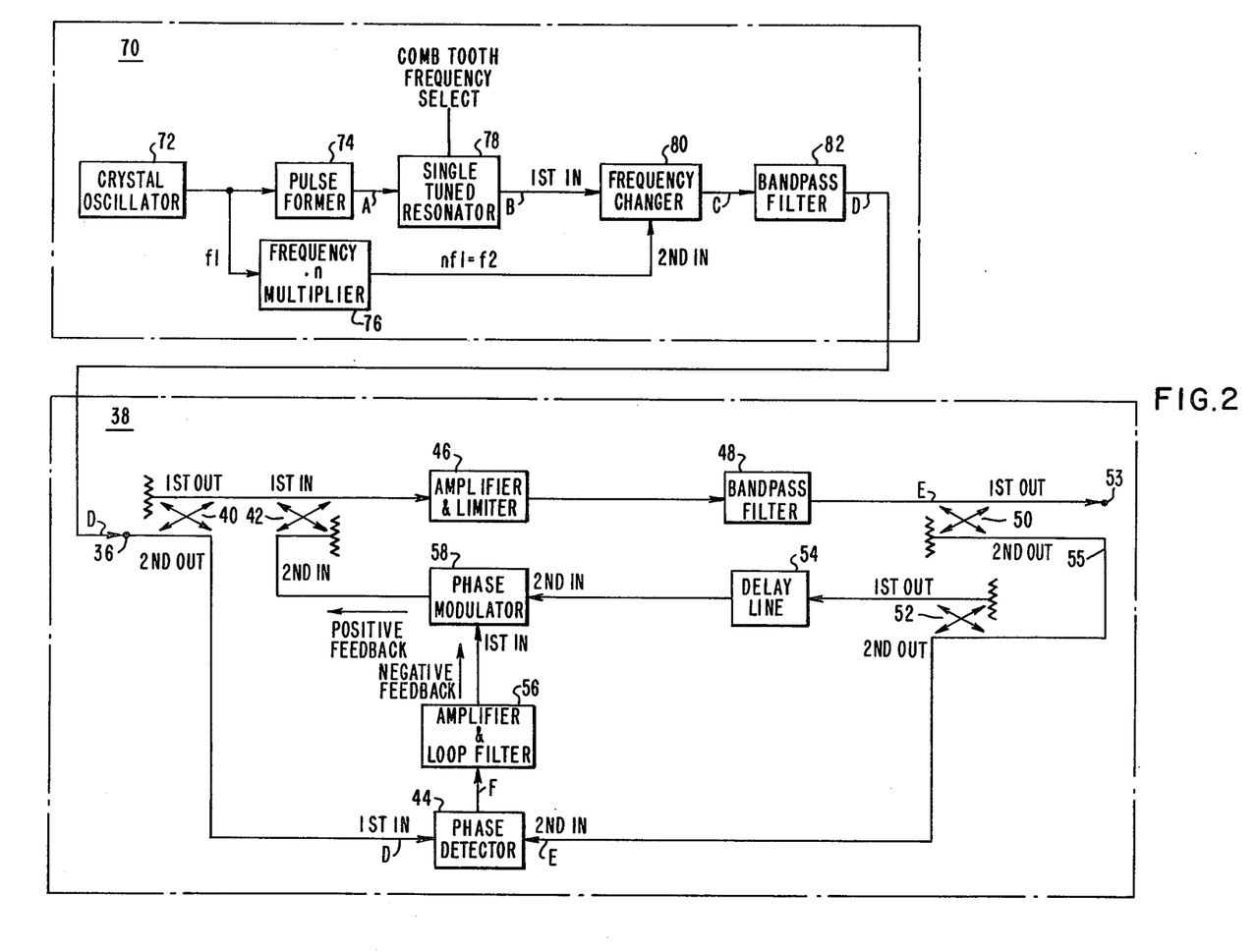
FIG. 2 is a block diagram of one embodiment of the invention.

Referring to FIG. 2, input signal D to oscillator 38 has a low $L(f)$ for a selected frequency. The selected frequency is enhanced in amplitude above other frequencies in signal D, such as the frequencies of a comb spectrum (see FIG. 7). Signal D at terminal 36 is coupled to an input of coupler 40, a first output of coupler 40 is connected to a first input of coupler 42, and a second output of coupler 40 is connected to the first input of phase detector 44. The first output of coupler 42 is connected to the input of amplifier and limiter 46, which has an output connected to the input of bandpass filter 48. Amplifier and limiter 46 is conventional in the art and may be, for example, Model AP-1000T, manufactured by Avantek, Inc. Bandpass filter 48 is conventional in the art and may be, for example, Model MC10 and being typically a three or four section filter with a bandwidth of 25 to 50%, such as manufactured by K & L Microwave Inc. of Salisbury, Md. The output of bandpass filter 48 is coupled to an input of coupler 50 having a first output coupled to terminal 53, which is the ouput of the oscillator, the output being designated signal E. A second output of coupler 50 is connected to an input of coupler 52 having a first output connected to the input of delay line 54 and a second output connected to the second input of phase detector 44. The output of phase detector 44 is connected to the input of amplifier loop filter 56, which has an output connected to the first control input of phase modulator 58. The output of delay line 54 is connected to a second input of phase modulator 58 which has an output coupled to a second input of coupler 42. For operation of the phase locked oscillator 38 in the L band typically at frequencies from 1200 to 1300, the couplers 40, 42, 50 and 52 are commercially available, such as manufactured by Watkins-Johnson Company. The delay line may be a spiral of small, semi-rigid coaxial cable, having a length to provide 159 nanosecond delay.

Figure 6:
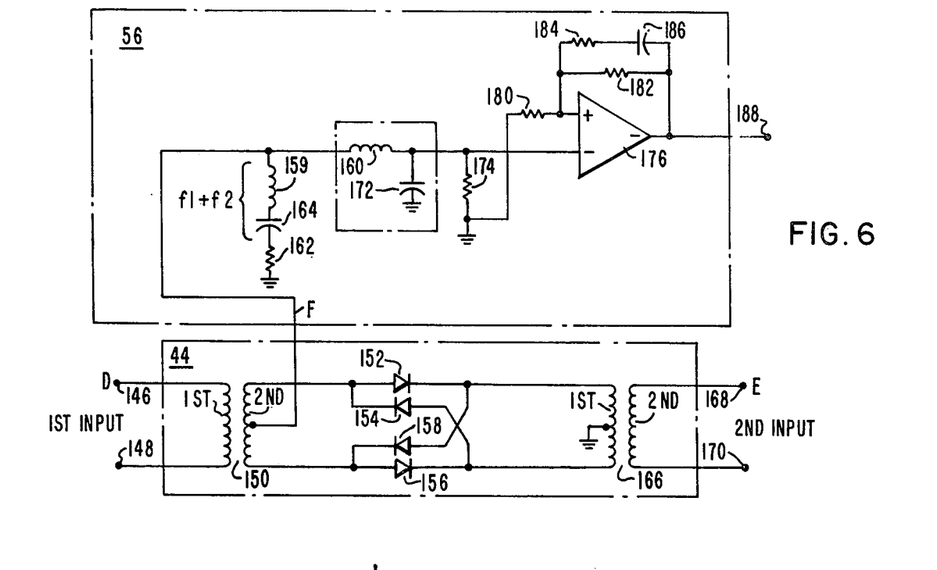
FIG. 6 is a circuit diagram of a phase detector.

Phase detector circuitry that may be used is shown in more detail in FIG. 6. The amplifier and negative feedback loop filter 56 may be constructued from low noise operational amplifiers in combination with a resistor-capacitor circuit to provide filtering, such as shown in FIG. 6. Phase modulator 58 may utilize varactor diodes in combination with a circulator arrangement to achieve a voltage controlled phase shift. Phase modulator 58 is conventional and may be obtained from the ANZAC Division of Adams Russell, Waltham, Massachusetts.

Figure 4:
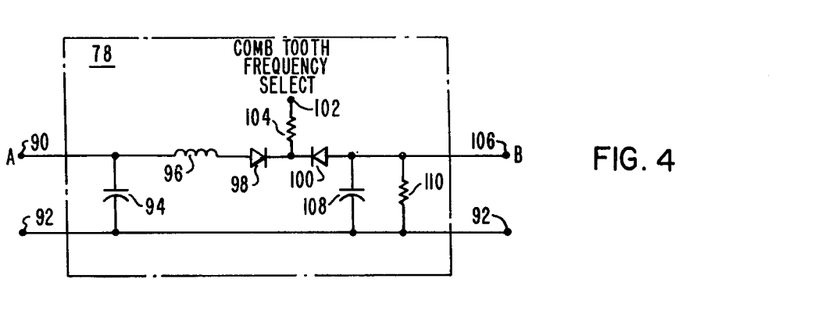
FIG. 4 is a circuit diagram of a single tuned voltage tunable resonator.
Figure 5:
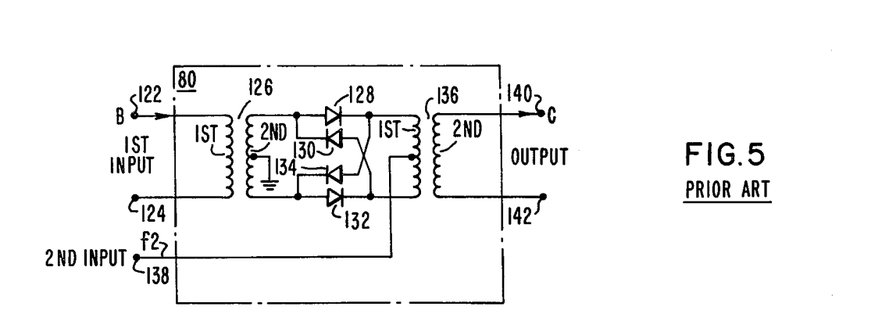
FIG. 5 is a circuit diagram of a frequency changer of the prior art.

An agile frequency source 70 capable of providing one of a number of frequencies, each having a low $L(f)$ for generating an input signal D is shown in FIG. 2. Crystal oscillator 72 is coupled to the input of pulse former 74 and the input of frequency multiplier 76. Crystal oscillator 72 provides a frequency with low $L(f)$, such as described in U.S. Pat. No. 3,836,873, issued Sept. 17, 1974 to Daniel J. Healey (the inventor herein) and Michael M. Driscoll, entitled "Low Noise VHF Crystal Harmonic Oscillator", which is incorporated herein by reference. Pulse former 74 is conventional in the art and functions to generate a band-limited comb spectrum or multiple frequencies of the input frequency. The output of pulse former 74 is connected to the input of single tubed resonator 78, which is controlled by a comb frequency select signal. One example of circuitry to implement a voltage tunable single tuned resonator 78 is shown in FIG. 4. The output of the single tuned resonator 78 is connected to a first input of frequency changer 80. Frequency multiplier 76 which functions to multiply the crystal oscillator frequency by an integer to provide a coherent high frequency signal, such as about 1200 megahertz, is conventional in the art. The output of frequency multiplier 76 is coupled to a second input of frequency changer 80. One example of circuitry for frequency changer 80 is shown in FIG. 5. The output of frequency changer 80 is coupled to the input of bandpass filter 82. Bandpass filter 82 is conventional in the art. The input of the bandpass filter 82 must terminate with a suitable impedance at the out-of-band frequencies to provide a low standing wave ratio (SWR) at out-of-band frequencies from the frequency changer 80. The typical bandpass is 10 to 15% of the center frequency. The center frequency is typically 400 to 1000 MHZ. The single tuned resonator 78 functions to select one frequency or tooth from the band-limited comb spectrum from pulse former 74 and to attenuate the other frequencies or teeth in the comb spectrum under the control of a comb tooth frequency select signal. The frequency changer 80 adds the frequency of the first input at the frequency of the second input to provide the sum frequency at the output. The output of bandpass filter 82 is coupled to terminal 36 which is the input of oscillator 38.

Figure 3:
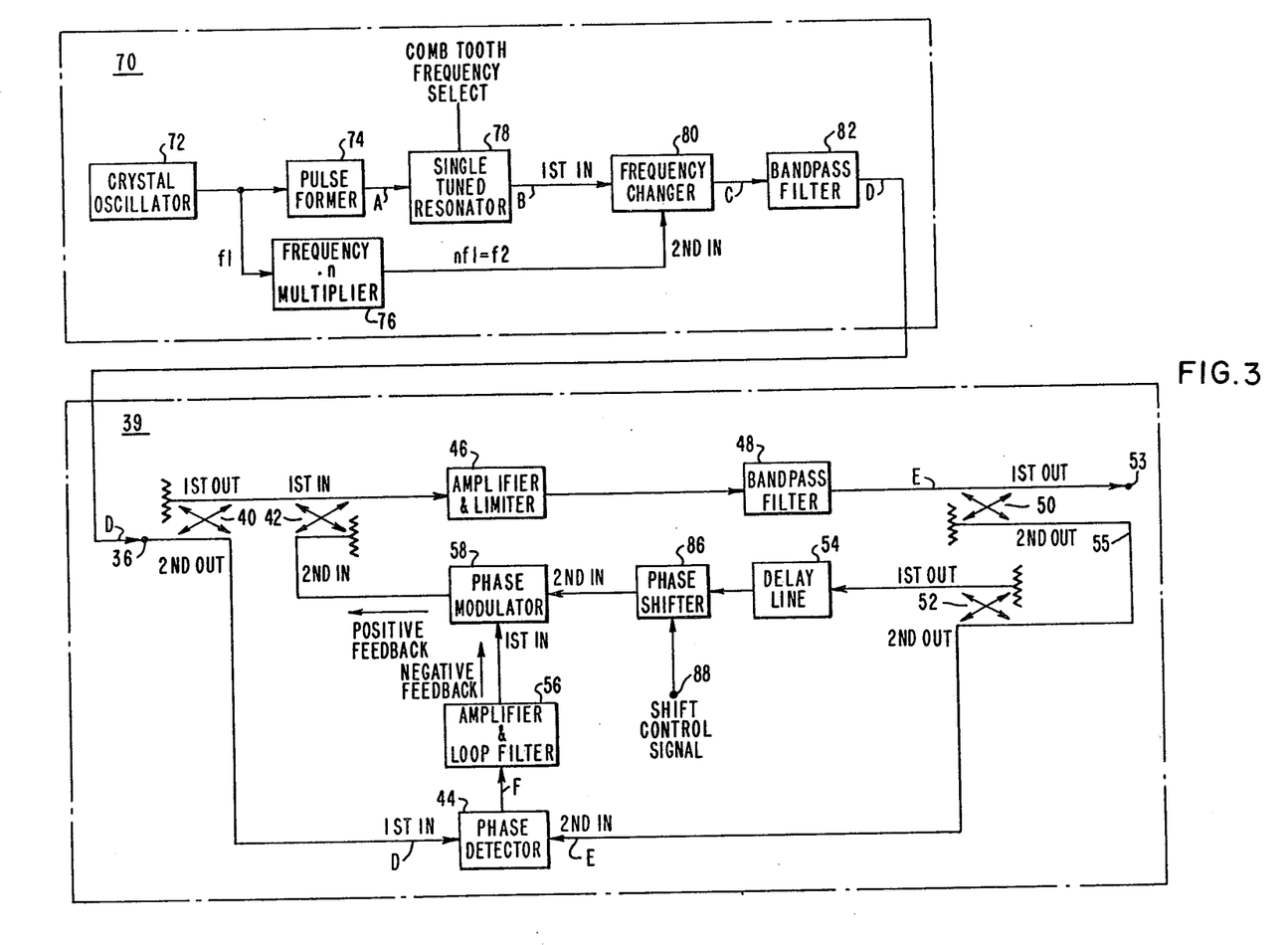
FIG. 3 shows a block diagram of an alternate embodiment of the invention.

Referring to FIG. 3, the embodiment of FIG. 2 is shown, except for the addition of phase shifter 86, which is controlled by shift control signal at a terminal 88. Phase shifter 86 is inserted between the signals passing from delay line 54 to phase modulator 58. Specifically, the output of delay line 54 is coupled to the input of phase shifter 86 and the output of phase shifter 86 is connected to the input of phase modulator 58. Phase shifter 86 functions to provide a shift in the phase of the delayed feedback signal which may vary the total loop phase shift of the feedback signal to vary the natural oscillation frequency of the delay line oscillator 39. In addition, phase shifter 86 may provide adjustments to the loop phase shift in the feedback loop to compensate for changes in the total delay due to temperature. Shift control signal may be swept or changed to provide a continuing phase shift change to essentially sweep the natural frequency of the delay line oscillator 39 until locking occurs with the input signal D.

FIG. 4 shows the circuitry of a single tuned resonator having a first input terminal 90 and a second input terminal 92, terminal 90 is coupled to 92 by a capacitor 94. Terminal 90 is coupled to an inductor 96, which in turn is connected to the anode of a diode 98. The cathode of diode 98 is connected to the cathode of diode 100 and to terminal 102 through resistor 104. The anode of diode 100 is connected to terminal 106. Terminal 106 is coupled to terminal 92 through capacitor 108 and through resistor 110 connected in parallel. Diodes 98 and 100 are typically hyperabrupt junction diodes to provide a 2-1 tuning range under the control of a voltage placed on terminal 102, such as comb tooth frequency select signal.

Referring to FIG. 5, one example of circuitry for a frequency changer is shown for adding together the frequencies of two input signals. One signal is placed on a first input on terminals 122 and 124. A first winding of transformer 126 is connected across terminals 122 and 124. A second winding of transformer 126 has a center tap connected to ground and one side connected to the anode of diode 128 and the cathode of diode 130. The other side of the second winding of transformer 126 is connected to the anode of diode 132 and the cathode of diode 134. The cathode of diode 128 and the anode of diode 134 are connected together and to one side of a first winding of transformer 136. The anode of diode 130 and the cathode of diode 132 are connected together and to the other side of the first winding of transformer 136. The first winding of transformer 136 has a center tap which is connected to terminal 138, which is the second input of frequency changer 80. The second winding of transformer 136 is coupled across terminals 140 and 142, which serve as the output terminals for frequency changer 80. Diodes 128, 130, 132 and 134 should be Schottky barrier, hot carrier diodes. The signals presented on the first and second input of frequency changer 80 have low $L(f)$ for the selected frequencies.

Referring to FIG. 6, one example of circuitry for phase detector 44 and amplifier and loop filter 56 is shown. A first input to phase detector 44 is at terminals 146 and 148 which are connected across a first winding of transformer 150. One end of a second winding of transformer 150 is connected to the anode of diode 152 and the cathode of diode 154; the second end of the second winding of transformer 150 is connected to the anode of diode 156 and the cathode of diode 158. A center tap of the second winding of transformer 150 is coupled to inductor 159 and inductor 160. The other side of inductor 159 is coupled to resistor 162 through capacitor 164. The other side of resistor 162 is coupled to ground. Inductor 159 and capacitor 164 connected in series serves as a high frequency bypass filter as determined by the sum of the input frequencies at the first and second inputs of phase detector 44 and resistor 162 serves as a termination resistance for the bypassed high frequencies. The cathode of diode 152 and the anode of diode 158 are connected to the first end of a first winding of transformer 166, which has a center tap connected to ground. The anode of diode 154 and the cathode of diode 156 are connected to the secnd end of the first winding of transformer 166. The first and second ends of a second winding of transformer 166 are connected to terminals 168 and 170, respectively, which are the terminals for the second input of phase detector 44.

Inductor 160 is coupled to ground through capacitor 172 and resistor 174 connected in parallel. Inductor 160, resistor 174 and capacitor 172 function as a low pass filter where resistor 174 functions as a terminating impedance. Inductor 160 is also coupled to operational amplifier (op amp)176 at the non-inverting input terminal. The inverting input terminal of op amp 176 is coupled to ground through resistor 180. The inverting input of op amp 176 is also coupled to its output through resistor 182 and coupled to its output through resistor 184 and capacitor 186 connected in series. The output of the op amp is connected to terminal 188 and provides a DC and/or low frequency control signal indicative of the phase difference between the RF or microwave signals presented on the first and second input of phase detector 44. Diodes 152, 154, 156, and 158 should be hot carrier Schottky barrier diodes.

Figures 7, 8:
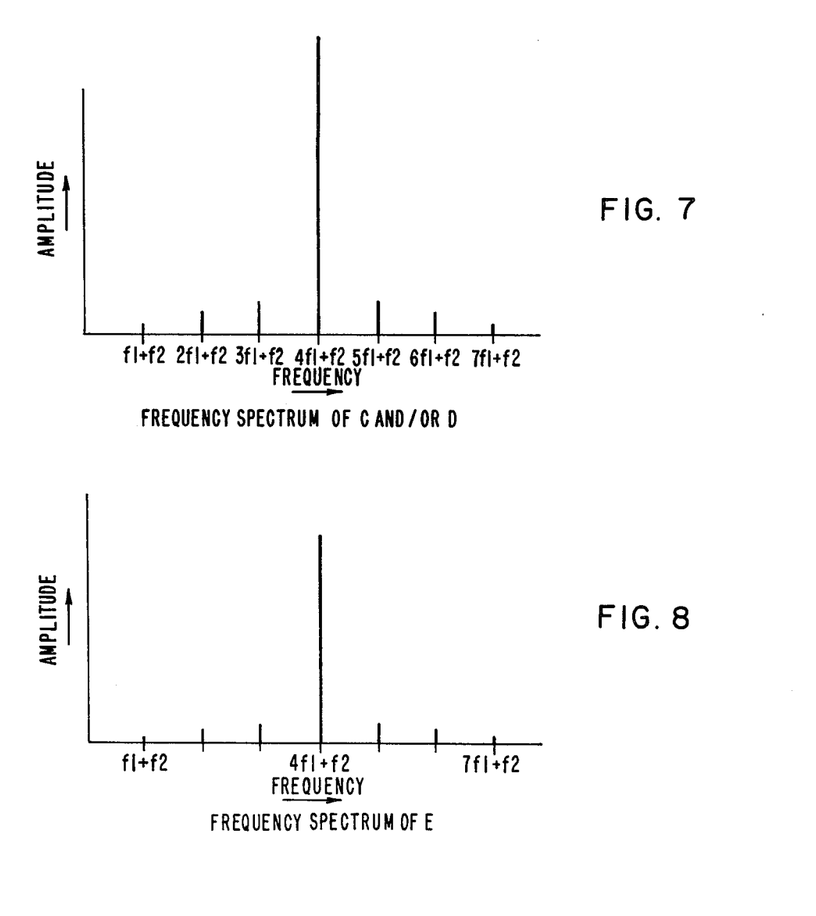
FIGS. 7–10 show frequency spectrums at key circuit points resulting from operation of the invention as shown in FIG. 2.

In operation, agile frequency source 70 provides an input signal D to terminal 36 of oscillator 38 as shown in FIG. 2. Input signal D has low phase sideband noise, i.e., $L(f)$. The input signal D has one tooth of a comb spectrum enhanced by typically ten decibels above the other teeth or frequencies in the comb spectrum. The teeth in the comb spectrum may, for example, correspond very nearly to the natural frequencies of oscillator 38, where the delay line element has a delay of 159 nanoseconds which would provide natural frequencies spaced by 6.28 megahertz. The input signal D at terminal 36 passes through couplers 40 and 42 to amplifier and limiter 46 where the signal is amplified and limited before being passed on to bandpass filter 48. Amplifier 46 should provide typically about 30 db in gain and the bandpass filter should have a bandwidth of typically 25 to 50% of the input frequency, for example. Input signal D may be either an RF signal or microwave carrier signal and may, for example, be in the range from 1200 to 1300 megahertz. The output of bandpass filter 48 passes through coupler 50 to terminal 53 which is the output terminal for oscillator 38. The output or signal E on terminal 53 is illustrated in FIG. 8 as shown by frequency spectrum E. A portion of the output of bandpass filter 48 passes through coupler 50 and through coupler 52 to delay line 54, which provides a delayed feedback signal. The output of the delay line 54 passes through phase modulator 58 and through coupler 42 to the input of amplifier and limiter 46. Coupler 42 receives the delayed feedback signal which has been phase shifted and combines it with the input signal D, and couples them to the amplifier and limiter 46. Couplers 40 and 42 provide isolation of the delayed feedback signal from the input signal D at terminal 36 and at the first input of phase detector 44.

A portion of the input signal, signal D, passes through coupler 40 to the first input of phase detector 44 which is isolated from the feedback signal at the input of amplifier and limiter 46. A portion of the output signal of bandpass filter 48 passes through couplers 50 and 52 to the second input of phase detector 44. Phase detector 44 provides a signal indicative of the phase difference of the signals at the first and second inputs, designated signal F. The output of phase detector 44, signal F, is amplified and filtered by amplifier and loop filter 56 to provide a voltage indicative of the phase difference of the signals at the first and second input of phase detector 44 which has been filtered. The output signal of amplifier and loop filter 56 provides the control signal for phase modulator 58 which adjusts the phase of the feedback signal coming from delay line 54.

Phase modulator 58 is incorporated in the positive feedback loop of the delay line oscillator 38. Phase modulator 58 is controlled by the phase error between the delay line oscillator output and the enhanced crystal controlled tooth frequency input, signal D. The phase error is amplified and filtered by amplifier and loop filter 56 to provide a high performance negative feedback control of the phase of oscillator 38. In this way, $L(f)$ of the delay line oscillator with a spacing on the order of 6 megahertz for the natural frequencies can be reduced to the level of the crystal controlled signal over the frequency range of the frequencies in the comb spectrum of the input signal D.

Since the effective phase locked loop bandwidth of oscillator 38 will be less than 50 kilohertz, the excess phase caused by the transport delay will be $-50 \times 10^3/(6 \times 10^6) \times 360 = -3°$. A well damped loop with well behaved transient response is feasible. Critical damping should never be used, since it will result in $L(f)$ peaking at a frequency in the vicinity of the phase locked loop bandwidth.

To insure that the acquisition time of the phase locked loop oscillator is less than about 50 microseconds, the initial error or difference between the frequency of the input signal D, which may be a crystal controlled "tooth" frequency, and the associated natural frequency of the delay line oscillator should not exceed about ± 50 parts per million. In order to assure that the input frequency, signal D, and the natural frequency of the delay line oscillator are within 50 parts per million, an examination of the frequency stabilization of the input signal and of the delay line oscillator must be made. If the input signal has a crystal controlled source, then temperature stabilization of the crystal with a single stage control can readily achieve a $1 \times 10^{-6}$ stability. Without temperature stabilization or control, the crystal may achieve ± $20 \times 10^{-6}$ stability, which is typical. The controlling frequency element in the delay line oscillator is the delay time of the delay line element 54. Based on the linear coefficient of thermal expansion of coaxial material used in the delay line element 54, for example, one would expect about $+20 \times 10^{-6}$ per degreee celsius worst case frequency change. Therefore, to control the input frequency and the natural frequency of the delay line oscillator to within ± 50 parts per million, temperature stabilization of the delay line and the crystal is required. Regulation to an adequate high temperature to accommodate the highest ambient temperature to an accuracy of 5° celsius appears necessary.

Referring to FIG. 3, an alternate embodiment of the invention is shown which is the same as the embodiment shown in FIG. 2, except for the addition of a new element, a phase shifter 86 which is inserted between phase modulator 58 and delay line 54. Phase shifter 86 is responsive to a shift control signal which is placed on terminal 88 which is coupled to the control input of phase shifter 86. The control signal for the phase shifter, however, would be derived from a temperature sensor with appropriate conversion factors from temperature to voltage or current. The phase shifter 86 in the positive feedback loop of the delay line oscillator 38 can be used to change the phase of the delayed feedback signal until the frequency of the delay line oscillator 38 is within the allowable 50 parts per million difference in input frequency to natural delay line oscillator frequency. The phase shifter 86 in combination with the control signal that is measurement of temperature eliminates the need for temperature control of either the crystal unit in crystal oscillator 72 or the delay line 54 when the input frequency, signal D, is specified as within 20 parts per million. Even if the crystal unit, such as used in crystal oscillator 72, is temperature stabilized to meet an input signal frequency tolerance of $1 \times 10^{-6}$, the delay line 54 of oscillator 38 would not require temperature stabilization.

Referring to FIG. 2, the effect of input signal D on the oscillator 38 without the operation of phase modulator 58 is only the equivalent to the behavior of a first order phase locked loop. Such behavior will not therefore yield the desired $L(f)$. The reason is that for offset frequencies less than about 50 kilohertz, the $S_\delta \phi (f)$ of the delay line oscillator's amplifier-limiter exhibits a $1/f$ power spectral density. The effect of the positive feedback via the delay line 54, without operation of the phase modulator 58, with the $d\phi/d\omega$ property of the phase locked loop oscillator is to convert this into a $1/f$ spectral density for $S \phi (f)$. This is equivalent to a $1/f^3$ spectrum for $L(f)$. Reference is made to a publication by John H. Shoaf, et al, entitled "Frequency Stability Specification and Measurement: High Frequency and Microwave Signals", National Bureau of Standards, Technical Note 632, distributed by National Technical Information Service, COM-73-50238, 65P, January 1973 for a detailed discussion of the terms $L(f)$, $S_\delta \phi (f)$ and $S \phi (f)$. With $159 \times 10^{-9}$ second delay, the equivalent half bandwidth of the delay line oscillator is $1/(2\pi\tau) = 1.00$ megahertz.

A conservative value for $S_\delta \phi (100)$ in the delay line oscillator-limiter is $1.2 \times 10^{-13}$ radians$^2$/hertz. This then will cause $L(100)$ for the $150 \times 10^{-2}$ delay line oscillator to be $-54$ db/hertz which will decrease at $1/f^3$ power density to $-114$ db/hertz at 10797 hertz, and $-130$ db/hertz at 36866 hertz for the case without negative feedback via phase modulator 58. With negative feedback via the phase modulator 58 a $1/f^4$ transmission characteristic is realized.

For the case without the negative feedback via phase modulator 58 and with the effective noise figure of 10 db in the delay line oscillator amplifier-limiter, the ultimate $L(f)$ will not be less than $-164$ db/hertz. There is no frequency selective filtering of the noise in the delay line oscillator. Once $L(f)$ reaches $S_\delta \phi (f)$, the latter dominates as an additive noise so that $L(f)$ reverts from $1/f^2$ noise sideband spectrum to a constant noise sideband spectrum. This condition will then occur at $f \approx$ 501 kHz.

The negative feedback control via phase modulator 58 is required in the phase locked oscillator since $L(f)$ of the free running delay line oscillator has a $1/f^3$ spectrum below 20 kHz Fourier frequency and the injection loop characteristic due to the input signal is only $1/f^2$ power transmission. Thus, without an additional negative feedback loop via the phase modulator, the $L(f)$ of the delay line oscillator will not be reduced to the level of the crystal control signal even if the input priming signal provides 20 kHz bandwidth for the negative feedback control via the priming signal.

A larger input signal is not desirable since the $L(f)$ of the delay line oscillator at a Fourier or offset frequency from $f_o$ greater than 20 kHz will be less than that of the crystal control signal in absence of the crystal control signal. Thus, phase modulator 58 controls the phase error between the delay line oscillator and the input signal so that a $1/f^3$ open loop feedback transmission for control of the phase modulator can be realized.

In FIG. 2, agile frequency source 70 provides input signal D to the oscillator 38. Crystal oscillator 72 provides a signal with a frequency having low $L(f)$ to pulse former 74 which transforms the input frequency to a multiple number of frequencies, each having a low $L(f)$ which is applied to the single tuned resonator 78. The crystal oscillator 72 also provides the same output signal to frequency multiplier 76 which provides an output having a single multiple frequency of the input frequency. Frequency multiplier 76 multiplies the input frequency by a fixed integer. Pulse former 74 may also include a low noise digital divider to provide a lower input frequency $f_1$ for excitation of the pulse former 74 thereby allowing the crystal oscillator 72 to have a correspondingly higher frequency. A higher frequency from crystal oscillator 72 allows a lower integer n for multiplication in frequency multiplier 76 which helps to reduce the phase noise at the output of frequency multiplier 76. The output of frequency multiplier 76 is fed to frequency changer 80; the single tuned resonator 78 selects one tooth of the band-limited comb frequency spectrum provided by pulse former 74 in response to a comb tooth frequency select signal. An example of an output signal of pulse former 74 is shown as frequency spectrum A in FIG. 9. An example of a typical signal output of the single tuned resonator 78 is shown as frequency spectrum B in FIG. 10. Frequency changer 80 has the frequency of the signals on the first and second input of frequency changer 80 to be added or summed to provide an output signal C. A typical example of the output of frequency changer 80 is shown by frequency spectrum C in FIG. 7, which is the same as the frequency spectrum D, except that frequency spectrum D has been passed through bandpass filter 82. The output of frequency changer 80 passes through bandpass filter 82 and is coupled to the input of oscillator 38 as input signal D.

Figure 9:
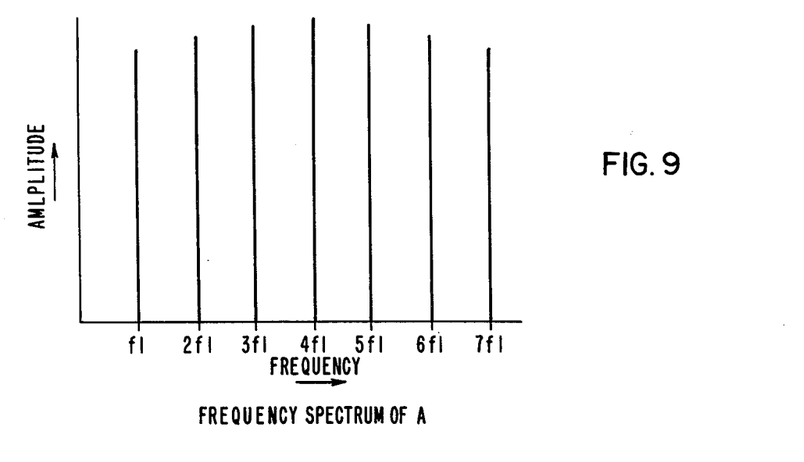
Figure 10:
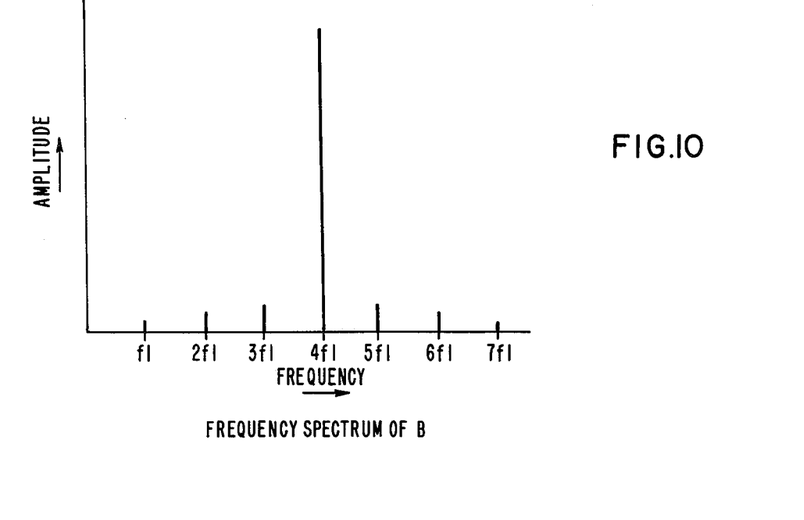

By changing the comb frequency select signal, other frequencies of the comb spectrum, as shown in FIG. 9, may be selected which would be added to the frequency output of the frequency multiplier 76 $f2$ to provide a signal D which has the frequency equal to $f2$ plus the tooth frequency of the comb spectrum of pulse former 74 selected.

Agile frequency source 70 therefore provides a multiple frequency source, each having low $L(f)$. For example, the crystal oscillator may have a frequency of 6.28 megahertz; the pulse former may provide a 24 frequency comb spectrum from 6.28 to 150.72 megahertz; and frequency multiplier 76 may multiply the input frequency by 200 which would provide an output frequency $f2$ of 1256 megahertz. Depending upon the comb frequency select signal, agile frequency source 70 may provide frequencies from 1262.28 megahertz to 1406.72 megahertz, each having a low $L(f)$.

A phase locked oscillator 38 provides an output having a $1/f^3$ power transmission characteristic for the negative feedback control by detecting the phase error of the input signal to the output signal and utilizing the signal indicative of the phase error to phase modulate a positive feedback signal of the oscillator. The input signal must have a frequency close to the natural frequency of the delay line oscillator as determined by the delay of the delay line element. The input signal must have a low $L(f)$ in order to provide an output signal with a reduced $L(f)$. An alternate embodiment is provided as shown in FIG. 3 where a phase shifter is provided in the positive feedback loop to adjust the natural frequency of the delay line oscillator to be close to the frequency of the input signal, thus avoiding temperature stabilization requirements.

I claim:

1. A method for generating a frequency signal with low phase fluctuations comprising the steps of:
   a. generating an input signal with low phase fluctuations;
   b. generating an output signal in accordance with a first portion of said input signal and a second feedback signal coupled together;
   c. generating a delayed feedback signal derived from said output signal, said delayed feedback signal having the same frequency as said output signal;
   d. generating a first signal indicative of the phase difference between a second portion of said input signal, and said output signal; and
   e. modulating the phase of said delayed feedback signal in accordance with said first signal to generate said second feedback signal whereby the phase fluctuations of said output signal are substantially reduced due to the presence of said second feedback signal.

2. The method of claim 1 wherein said step b of generating an output signal includes the steps of amplifying, limiting and filtering a first portion of said input signal and said second feedback signal.

3. The method of claim 1 wherein said step of generating a delayed feedback signal includes the step of delaying a portion of said output signal.

4. The method of claim 1 wherein said step of generating a first signal includes the step of detecting the phase error between said input and output signals to provide a phase error signal.

5. The method of claim 4 wherein said step of generating a first signal further includes the step of amplifying and filtering said phase error signal to provide said first signal.

6. The method of claim 1 wherein said step of modulating the phase of said delayed feedback signal is accomplished in accordance with the amplitude of said first signal.

7. The method of claim 1 wherein said step of generating an input signal includes the steps of frequency changing and filtering an oscillator signal to form said input signal.

8. The method of claim 1 wherein said step of generating an input signal includes the steps of:
  a. generating an oscillator signal with low phase fluctuations;
  b. generating a comb spectrum signal from said oscillator signal;
  c. selecting one frequency signal from said comb spectrum signal;
  d. multiplying said oscillator signal to generate a frequency multiple signal;
  adding said one frequency signal and said frequency multiple signal together to form an input signal and
  filtering said input signal by rejecting frequencies outside a selected band.

9. Electronic apparatus for generating a low phase noise frequency output signal comprising:
  first amplifier means for generating an output signal in accordance with an input signal having low phase fluctuations and a second feedback signal coupled together;
  second means for generating a delayed feedback signal derived from said output signal, said delayed feedback signal having the same frequency as said output signal; and
  third means coupled to said first amplifier means for generating a first signal indicative of the phase difference between said input and output signals; and means for phase modulating said delayed feedback signal in accordance with said first signal to generate said second feedback signal
  whereby the phase fluctuations of said output signal are substantially reduced due to the presence of said second feedback signal.

10. The apparatus of claim 9 wherein said first amplifier means includes an amplifier, limiter, and filter.

11. The apparatus of claim 9 wherein said output and input signals are RF signals.

12. The apparatus of claim 9 wherein said second means includes means for delaying a portion of said output signal.

13. The apparatus of claim 10 wherein said third means includes a phase detector for generating said first signal.

14. The apparatus of claim 9 wherein said third means includes an amplifier and filter for generating said first signal.

15. The apparatus of claim 9 wherein said means for phase modulating includes a phase modulator responsive to said first signal.

16. The apparatus of claim 9 wherein said means for phase modulating includes a phase modulator responsive to the amplitude of said first signal.

17. The apparatus of claim 9 wherein said means for phase modulating includes means for coupling to said first amplifier means a modulated feedback signal having an amplitude less than the amplitude of said input signal.

18. The apparatus according to claim 9 further comprising means for generating said input signal wherein said input signal has low phase fluctuations.

19. The apparatus of claim 18 wherein said means for generating said input signal includes a crystal oscillator.

20. The apparatus of claim 19 wherein said means for generating said input signal includes a pulse former coupled to said crystal oscillator for generating a frequency comb spectrum wherein each tooth of said comb spectrum represents a frequency of predetermined amplitude, a comb tooth frequency select signal, a single tuned resonator responsive to said comb tooth frequency select signal for selecting one frequency from said comb spectrum.

21. The apparatus of claim 20 wherein said means for generating said input signal further includes a frequency multiplier for generating multiple frequencies of said crystal oscillator;
  a frequency changer coupled to the output of said single tuned resonator and the output of said frequency multiplier for adding the frequencies of the respective output signals;
  a bandpass filter coupled to the output of said frequency changer for rejecting frequencies outside a predetermined frequency band to provide said input signal.

* * * * *